United States Patent [19]

Javanifard et al.

[11] Patent Number: 5,767,735
[45] Date of Patent: Jun. 16, 1998

[54] VARIABLE STAGE CHARGE PUMP

[75] Inventors: Jahanshir J. Javanifard, Sacramento; Kerry D. Tedrow, Orangevale; Jin-Lien Lin, Rancho Cordova; Jeffrey J. Evertt, Orangevale; Gregory E. Atwood, San Jose, all of Calif.

[73] Assignee: Intel Corporation

[21] Appl. No.: 720,943

[22] Filed: Oct. 3, 1996

Related U.S. Application Data

[62] Division of Ser. No. 537,233, Sep. 29, 1995, Pat. No. 5,602,794.

[51] Int. Cl.$^6$ ................................................. G05F 1/10
[52] U.S. Cl. ........................................ 327/536; 363/60
[58] Field of Search .............................. 327/534, 535, 327/536; 363/59, 60; 307/110

[56] References Cited

U.S. PATENT DOCUMENTS

| | | | |
|---|---|---|---|
| 3,824,447 | 7/1974 | Kuwabara | 363/60 |
| 4,807,104 | 2/1989 | Floyd et al. | 369/59 |
| 5,008,799 | 4/1991 | Montalvo | 363/59 |
| 5,297,104 | 3/1994 | Nakashima | 365/230.06 |
| 5,406,517 | 4/1995 | Chang et al. | 365/189.09 |
| 5,477,499 | 12/1995 | Van Buskirk et al. | 365/185.12 |
| 5,483,486 | 1/1996 | Javanifard et al. | 327/536 |
| 5,508,660 | 4/1996 | Gersbach et al. | 331/17 |
| 5,553,030 | 9/1996 | Tedrow et al. | 365/226 |
| 5,579,274 | 11/1996 | Van Buskirk et al. | 365/208 |
| 5,602,794 | 2/1997 | Javanifard et al. | 327/148 |

FOREIGN PATENT DOCUMENTS

| | | |
|---|---|---|
| 3-136522 | 6/1991 | Japan . |
| 4-355661 | 12/1992 | Japan . |

*Primary Examiner*—Timothy P. Callahan
*Assistant Examiner*—Kenneth B. Wells
*Attorney, Agent, or Firm*—Blakely, Sokoloff, Taylor & Zafman

[57] ABSTRACT

A variable stage charge pump for a flash memory device is described. The variable stage charge pump includes a first charge pump and a second charge pump. A first switch couples an output of the first charge pump to an input of the second charge pump. A second switch couples an input of the first charge pump to the input of the second charge pump. The first and second charge pumps are series-coupled to a common output node when the first switch is in a first position and the second switch is in a second position, wherein the first and second charge pumps are parallel-coupled to the common output node when the first switch is in the second position and the second switch is in the first position.

4 Claims, 3 Drawing Sheets

5,767,735

1

VARIABLE STAGE CHARGE PUMP

This is a divisional of application Ser. No. 08/537,233, filed Sep. 29, 1995, now U.S. Pat. No. 5,602,794.

FIELD OF THE INVENTION

This invention relates to the field of charge pumps. More particularly, this invention relates to providing a charge pump having a variable number as opposed to a fixed number of stages according to charge pump power supply input levels and desired charge pump output levels.

BACKGROUND OF THE INVENTION

A current trend in the electronics industry is to reduce the power requirements of integrated circuitry. In order to reduce power consumption, integrated circuits are being designed to use lower voltage supply levels such as 3.3 volts instead of 5 volts, for example.

Many operations, however, require voltages greater than that provided by the lower voltage power supplies. For example, flash electrically-erasable programmable read only memory (flash EEPROM) requires approximately 12 volts for erase and programming operations.

Charge pump technology permits the generation of voltages having a magnitude greater than that of the power supply. Through the use of charge pump circuitry 12 volts can be generated from 3.3 volts by using one or more charge pump stages.

In the electronics field, the practitioner often needs to generate a number of voltages from one available power supply voltage. For example, computer memory circuitry might require one voltage for reading, another voltage for writing, and yet a third voltage for erasing the memory. Alternatively, different components of the computer system (such as different types of memory) may have power supply requirements that differ from each other and from the available power supply voltage.

Another factor to consider when designing integrated circuits is that even though a trend might indicate a general acceptance of a progression towards another power supply level, there may be an established base of circuitry that will not readily change. For example, although a current trend may be moving towards a 3.3 volt power supply system, there may be an established base of hardware dependent upon a 5 volt power supply.

One prior art method used to generate multiple higher voltage levels from a single power supply voltage is to use a number of charge pump circuits each having a fixed number of stages. One disadvantage of this method is that each charge pump circuit requires a dedicated space in the integrated circuit. Another disadvantage is that the integrated circuit might not be able to be interchangeably used with both a 3.3 volt power supply and a 5 volt power supply without additional external circuitry. For example, a manufacturer might find it advantageous to provide a single flash memory product that could accommodate different power supplies.

Another prior art method used to generate multiple higher voltage levels from a single power supply voltage is to use one charge pump circuit that used a fixed number of stages to generate a voltage level. Other voltage levels are provided by using voltage divider networks in conjunction with the single charge pump. One disadvantage of this method is that power is wasted on the voltage divider networks. Another disadvantage is that the fixed stage method typically sacri-

2 fices performance at one power supply voltage to accommodate another power supply voltage.

SUMMARY AND OBJECTS OF THE INVENTION

A variable stage charge pump is described. The variable stage charge pump includes first and second charge pumps. A first switch couples an output of the first charge pump to an input of the second charge pump. A second switch couples an input of the first charge pump to the input of the second charge pump. The first and second charge pumps are series-coupled to a common output node when the first switch is in a first position and the second switch is in a second position. The first and second charge pumps are parallel-coupled to the common output node when the first switch is in the second position and the second switch is in the first position.

One object is to provide a charge pump that can accommodate different output levels for a given charge pump power supply input level.

Another object is to provide a charge pump that can accommodate a given output level for different charge pump power supply input levels.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
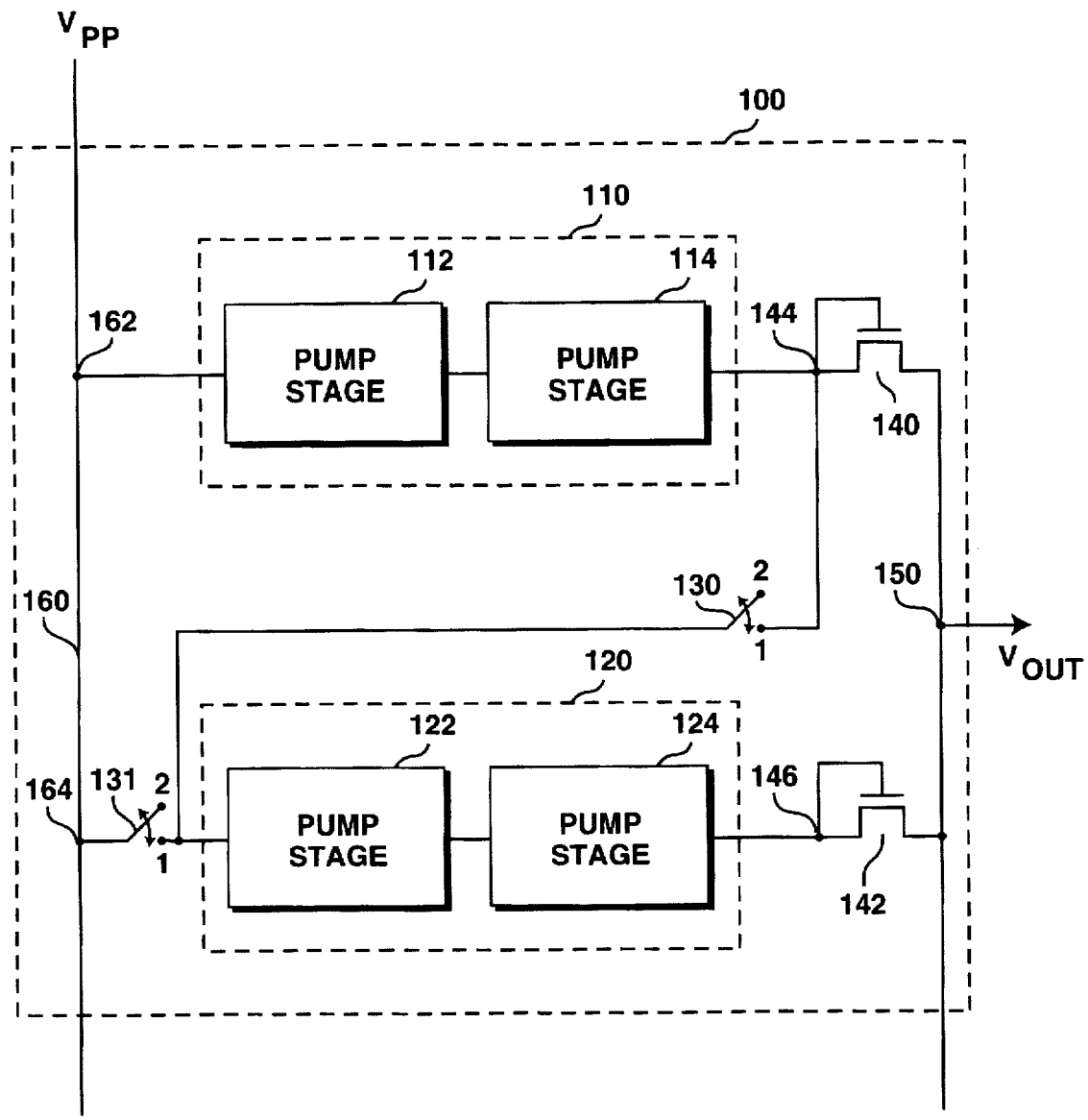
FIG. 1 illustrates a variable stage charge pump.

FIG. 1 illustrates one embodiment of a variable stage charge pump. Variable stage charge pump 100 includes a number of "rungs" (e.g., 162, 164). These rungs are coupled between a common input bus (160) and common output node 150. Each rung includes a charge pump. For example, rung 162 includes charge pump 110 and rung 164 includes charge pump 120. Each charge pump includes one or more fixed stages. In FIG. 1, the first charge pump (110) is made up of series-coupled charge pump stages 112 and 114. The second charge pump (120) is made up of series-coupled charge pump stages 122 and 124. A power supply voltage, Vpp, provides the supply voltage to common input bus 160.

A first switch (130) controls whether the output of the first charge pump is provided as an input to the second charge pump. A second switch (131) is used to couple the input of the second charge pump to Vpp. Switches 130 and 131 control whether charge pumps 110 and 120 are series-coupled or parallel-coupled. The variable stage charge pump 100 may also be identified by the expression "X/Y stage pump". In such a case, the "X" refers to the number of rungs (and therefore the maximum number of fixed stage charge pumps) that may be coupled in series. The "Y" indicates the number of stages for each fixed stage charge pump. Thus "X times Y" indicates the maximum number of stages that can be coupled in series between the common input bus and the common output node. In this example there are 2 rungs.

Each rung has a charge pump with 2 stages. Thus, variable stage charge pump 100 might also be referred to as a "2/2 stage pump". The 2/2 stage charge pump can couple all four stages in series or two series-coupled stages can be parallel coupled to the other two series-coupled stages.

There are four possible position combinations for switches 130 and 131 (two positions times two switches). The phrase "on" when referring to switches 130 and 131 means that the switches provide a current path. The phrase "off" when referring to switches 130 and 131 means that the switches are in an open-circuit state. In other words, the switches do not permit substantial current to flow through them. In one embodiment, switches 130 and 131 are implemented from metal oxide semiconductor field effect transistors (MOSFETs). In order to ensure that the greatest range of voltages can be passed by MOSFETs 130 and 131, $V_{OUT}$ from common node 150 is used as the control voltage to the MOSFET gates.

By choosing a different one of the four position combinations, the number of stages and the coupling of the charge pump stages to each other can be varied. The table below indicates the results of the four combinations:

TABLE 1

| Switch 130 | Switch 131 | Charge Pump 110 | Charge Pump 120 |
|---|---|---|---|
| OFF | OFF | ON | OFF |
| OFF | ON | ON | parallel-coupled to charge pump 110 |
| ON | OFF | ON | series-coupled to charge pump 110 |
| ON | ON | N/A | N/A |

From the above table, if both switches are off, charge pump 110 will be the only charge pump providing voltage to node 150. Thus, because charge pump 110 is a two stage charge pump, this configuration of switches 130 and 131 will effectively result in a two stage charge pump. This configuration might be used in a power saving mode if charge pump 100 is otherwise providing sufficient current and voltage output levels.

If switch 130 is off and switch 131 is on, charge pump 120 will be coupled so that charge pumps 110 and 120 are coupled in parallel to common output node 150. Because both 110 and 120 are two stage charge pumps, this means that charge pump 100 will effectively be a four stage charge pump having two sets of two stages coupled in parallel. In this configuration, charge pump 100 will provide approximately the same output voltage at node 150. Because 110 and 120 are parallel-coupled, charge pump 100 will be able to provide approximately twice the amount of current as was the case when only charge pump 110 was operating.

If switch 130 is on and switch 131 is off, charge pump 120 will be coupled so that charge pumps 110 and 120 are series-coupled. In other words, the input voltage for charge pump 120 will be provided from the output of charge pump 110. Because both 110 and 120 are two stage charge pumps, this means that charge pump 100 will effectively be a four stage charge pump with all four stages serially coupled. In this configuration, charge pump 100 will provide approximately twice the output voltage at node 150 as the previous two cases. However, charge pump 100 might only be able to provide approximately ½ the current as was the case when charge pumps 110 and 120 were parallel-coupled.

Table 1 indicates an "N/A" for the fourth configuration. "N/A" indicates that this configuration is not applicable because it should not be used. If both switches are on, the first charge pump will be shorted out because its output is coupled to its input and the supply voltage. Such operation may be harmful to the charge pump circuitry in this embodiment and should be avoided.

FIG. 1 also illustrates n-channel MOSFETs 140 and 142. Transistors 140 and 142 are connected in diode fashion between the outputs of charge pumps 110 and 120, respectively, and output node 150.

This prevents the charge pumps from shorting each other out when series-coupled. For example, if switch 130 is on and switch 131 is off, charge pump 120 would be shorted out without diode-connected transistor 140. If transistor 140 were not in place, node 144 would be connected to node 150. Node 144 would also be connected to the input of charge pump 120. Because the output of 120 is coupled to node 150, this would result in the output of charge pump 120 being coupled to the input of charge pump 120. Such a configuration would render charge pump 120 inoperative and thus the series-coupled configuration could not otherwise be obtained.

With transistor 140 in place, if the voltage at node 150 is greater than the voltage at node 144, no current can flow through transistor 140. This is the situation when the charge pumps are series-coupled. When charge pumps 110 and 120 are series-coupled, the voltage at node 146 will be greater than the voltage at node 144. If the voltage at node 146 exceeds the voltage at node 150 by the threshold voltage of transistor 142, transistor 142 will conduct to provide the voltage available at node 146 to node 150 (less the threshold voltage of transistor 142). As long as the voltage at node 144 less the threshold voltage of transistor 140 does not exceed the current voltage on node 150, transistor 140 will not conduct and will thus ensure stability of the series-coupled configuration for the charge pumps.

Using low threshold voltage MOSFETs helps to reduce the voltage drop across transistors 140 and 142 and thus a higher percentage of the voltage supplied by the charge pump stages will reach output node 150. Typical threshold voltages for low threshold voltage MOSFETs are usually less than 1 volt and typically range from 0.4 to 0.7 volts.

In one alternative embodiment, charge pump 100 is a negative charge pump providing voltages less than zero from Vpp. In such a case pump stages 112, 114, 122, and 124 are negative charge pumps. Vpp might be system ground. In order to function properly, transistors 140 and 142 are p-channel MOSFETs in this embodiment.

In another alternative embodiment, the variable stage charge pump might be constructed with n rungs of charge pumps, each charge pump having y stages. Thus the variable stage pump is an "n/y" stage pump according to the definition above. By selecting an appropriate subset of the first and second switches, the n charge pumps may be divided into m sets of p charge pumps. Each set is now an "p/y" variable stage charge pump. Now a variety of combinations can be achieved because the sets may be series- or parallel-coupled. Furthermore, the rungs within each set may be series- or parallel-coupled. For example, assume a variable stage charge pump having 12 rungs. Each rung includes one fixed stage charge pump. Each fixed stage charge pump includes 2 series-coupled stages. This is a 12/2 stage pump. Thus 12 pumps having two stages may be parallel-coupled, or all 24 stages may be series-coupled.

Figure 3:
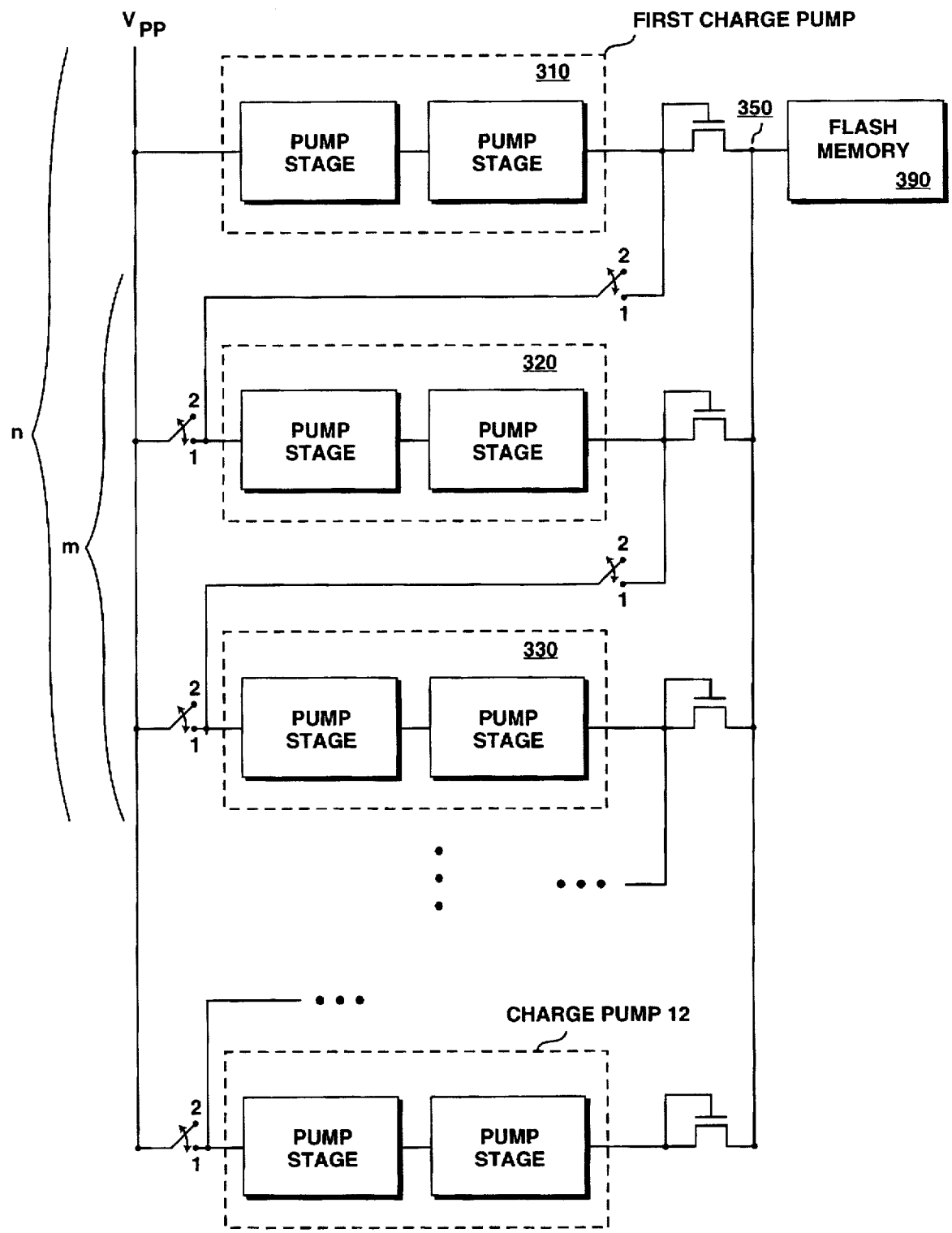
FIG. 3 illustrates a variable stage charge pump coupled to a flash memory array.

The 12 rungs may be grouped, however, into 4 sets of three rungs. Thus each set is a 3/2 stage pump. This means that within the defined set there are two possible combinations. Either all six stages may be coupled in series or three sets of two stages may be coupled in parallel. Furthermore, the four sets may be parallel-coupled or series-coupled. FIG. 3, for example, illustrates a variable stage charge pump with 12 rungs coupled to a flash memory array 390. Each rung includes a charge pump having 2 stages. Each charge pump has an input and an output. Consider the subset of the 12 charge pumps consisting of n charge pumps comprising first charge pump 310 and m other charge pumps 320–330.

The input of each of the m other charge pumps is coupled to the output of a preceding one of the n charge pumps 310–330 by an associated first switch. The first switch associated with the input of the first one of the m other charge pumps 320 is coupled to the output of first charge pump 310. The output of each of the n charge pumps is coupled to a same output node 350.

The input of each of the m other charge pumps is coupled by an associated second switch to the input of the first charge pump 310.

The n charge pumps are all series-coupled if all the first switches are in a first position and all the second switches are in a second position. The n charge pumps are all parallel-coupled if all the first switches are in a second position and all the second switches are in a first position.

The various combinations may be more easily seen using symbolic nomenclature. The nomenclature "S" and "P" indicates whether the rungs within each set are coupled in series or parallel. The symbols "||" and "-" indicate a parallel or a series coupling, respectively. Thus seven other possible combinations using these sets are S||S||S||S, P||P||P||P, S-S-S-S, and P-P-P-P, S-P-P-P, S-S-P-P, and S-S-S-P. Two of the combinations (i.e., P||P||P||P, S-S-S-S) are redundant with the combinations achievable without the step of dividing the rungs into sets. This example, however, illustrates how at least five additional power supply configurations can be achieved by individually controlling subsets of rungs.

In addition to these various configurations, a subset of all the rungs can be selected to provide power. In other words, by deselecting rungs using the appropriate associated second switches (i.e., switching them off), less than all the rungs can be used in the variable stage charge pump. This might be used to conserve power instead of utilizing all the stages and a voltage or current divider for the powered circuitry (e.g., memory circuitry). Voltage and current dividers tend to consume power and should be eliminated, if possible, in order to conserve power.

The definition of the naming convention of "X/Y" now changes slightly. Previously "X" meant the total number of rungs and each rung was treated as a fixed stage charge pump. Now, however, it is evident that by reconfiguring sets of rungs—each set is in essence a fixed stage charge pump. Therefore, "X/Y" now means X parallel coupled sets of charge pumps, each charge pump in the parallel-coupled set having Y serially-coupled stages.

Designing the variable stage charge pump with an appropriate number of stages permits a charge pump circuit that can provide the proper voltages for the memory circuitry irrespective of the available power supply voltage. For example, if 6 and 12 volt supplies are required from the variable stage charge pump, the designer can provide a control to the switches that will switch stages in and out, or change the coupling of the stages to ensure the appropriate output voltage from the variable stage charge pump regardless of the input voltage. The control for the switches would be a function of the available power supply voltage, Vpp, and the desired variable stage charge pump output voltage.

Typically the voltage provided by the variable stage charge pump should be greater than the voltage required by the circuitry to be powered because some losses might occur if the output of the variable stage charge pump is regulated.

In one embodiment, a variable stage charge pump might be used to provide the various voltage levels required by a flash memory array. A flash memory array is made of up memory cells including floating gate field effect transistor devices. These transistors can be programmed by changing the charge stored on a floating gate, and the condition (programmed or erased) may be detected by interrogating the cells. Different voltage requirements are needed by the flash memory cells for the different operational modes. A variable stage charge pump (or pumps) might provide the appropriate supply voltages for each mode of operation of the flash memory array. These modes include reading, programming, and erasing.

Typically a flash memory array is subdivided into blocks and the erase mode will erase one or more blocks of memory cells. The flash memory cell is erased by removing excess charge from the floating gate. The conventional method of erasing all the cells in a block of flash memory requires the application of 12 volts to the source terminals of all of the memory cells in the block while the drain terminals are left floating and the gate terminals are grounded.

Flash memory cells are programmed by placing excess charge on the floating gate to increase the threshold voltage of the flash memory cell. Programming is typically achieved by applying approximately 11–12 volts to the gate, 6–7 volts to the drain, and grounding the source terminal so that electrons are placed on the floating gate by hot electron injection.

Flash memory cells are read by applying a fixed voltage to the gate of the flash memory cell in order to determine whether the flash memory cell is in an erased or a programmed state. This technique senses the drain-to-source current, IDS for the flash memory cell. Reading a flash memory cell typically requires the application of 5 volts to the gate, 1 volt to the drain, and grounding the source terminal.

Thus, typical voltages required for flash memory applications include 5 volts for the read mode and 6 and 12 volts for both the program and erase modes. In one embodiment, power for the flash memory device is provided by two sources. These sources include a $V_{CC}$ line and a Vpp line. The $V_{CC}$ line is the primary power source for the flash device. The supplemental voltage provided by supply line, Vpp, is typically needed only when writing or erasing the memory because of the higher voltages needed during those operations. In one embodiment, $V_{CC}$ is approximately 5 volts. Vpp, however, might be 3.3, 5, or 12 volts.

Although 5 volts is a popular standard for Vpp, 3.3 volts is gaining in popularity. The variable stage charge pumps might be incorporated into the flash memory device in order to simplify external circuitry. To maximize the utility of a flash memory system, however, the variable stage charge pump must be able to generate approximately 5 volts, 9 volts, and 12 volts from either a 3.3 volt or 5 volt power supply.

Figure 2:
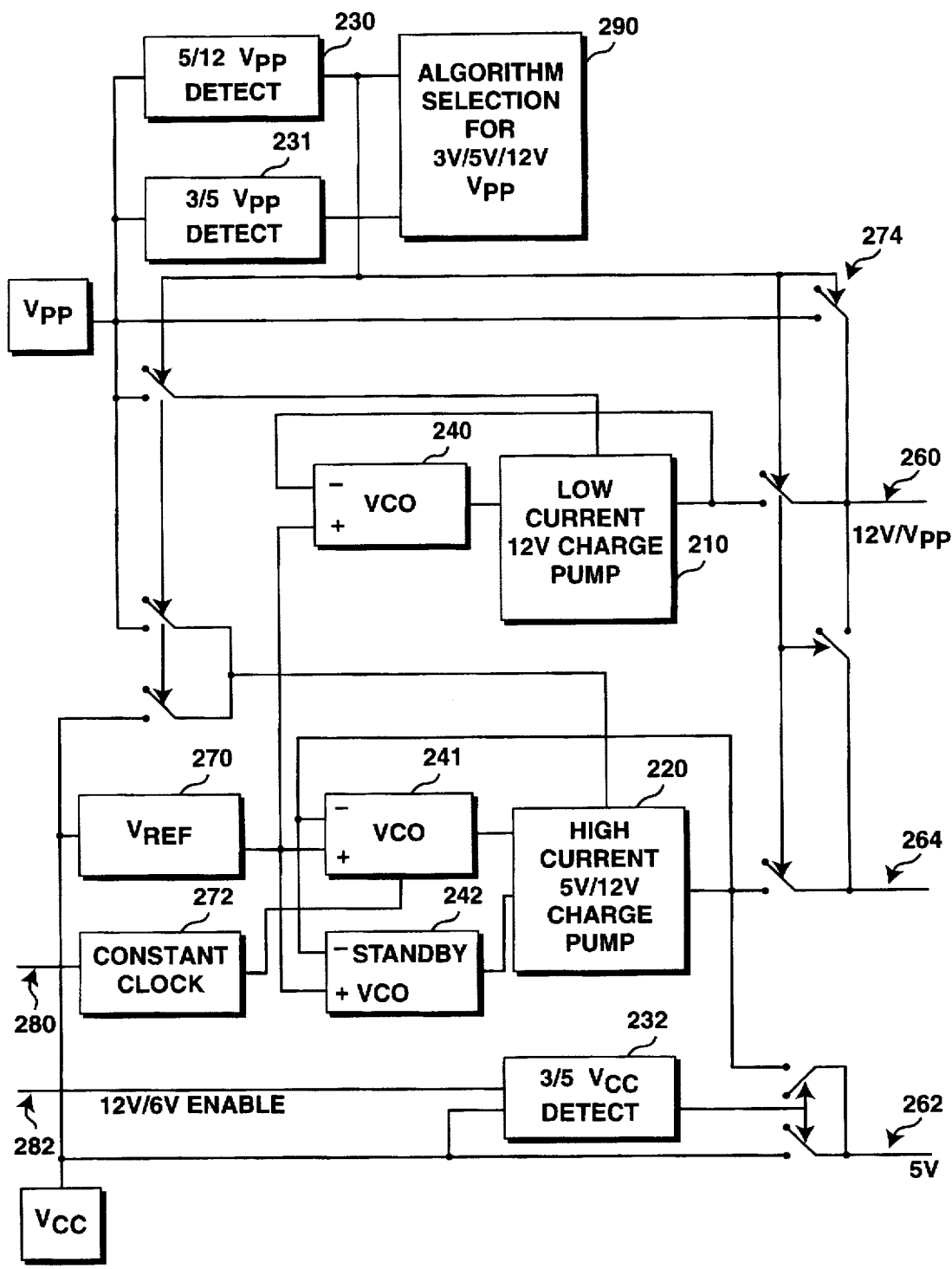
FIG. 2 illustrates circuitry including variable stage charge pumps for supplying power to a flash memory array.

FIG. 2 illustrates the power supply circuitry for a flash memory including variable stage charge pumps for accommodating a 5 volt, 9 volt, and 12 volt voltage level from either a 3.3 volt or 5 volt power supply. The variable stage charge pumps are designed to exceed the nominal required voltages because its output is routed to a voltage regulator. In addition, reasonable power supply tolerances typically require that the circuitry function properly when the input voltage is within a given percentage of the nominal value (10%, for example). This means that the output voltage from the charge pumps must depend on Vpp input voltages of 3.3 volts±10% or 5 volts±10%. Assuming a 10% lower Vpp than nominal, this means that the flash power supply circuitry must be able to provide the proper voltage and current levels to the flash arrays from a Vpp of approximately 3.0 volts or 4.5 volts.

In this embodiment, two charge pumps (210,220) are used to increase the internal node's voltages to different voltages during the read mode (5 volt charge pumps), the programming mode (12 volt and 9 volt charge pumps), and the erase mode (12 volt and 9 volt charge pumps). During the read mode when $V_{CC}$=3.3 volts, the wordlines must be pumped to 5 volts. The charge pumps are reconfigured depending upon Vpp (e.g., 3.3 or 5 volts) and the mode of operation of the flash memory (e.g., programming and erase mode).

The stage control for the variable stage charge pumps 210 and 220 is determined by the operational mode (i.e., erase, read, or program) and by the Vpp level. Level detectors 230, 231, and 232 determine Vpp and $V_{CC}$ levels. 5/12 volt Vpp detector 230 is used to determine whether Vpp is at 5 volts or 12 volts. Detector 230 indicates a Vpp of approximately 12 volts. Variable stage charge pump 220 is a high current variable stage charge pump used during the read, program, and erase operations. Variable stage charge pump 210 is a low current variable stage charge pump used in addition to charge pump 220 only during program and erase operations. The output of the Vpp detectors is provided to circuitry 290 to select the appropriate erase and programming algorithms for the various Vpp levels. These algorithms may vary depending upon Vpp and $V_{CC}$. Circuitry 290 controls the appropriate switches (e.g., switch 274) in accordance with the erase and programming algorithms. These switches are used, for example, for controlling power to charge pumps 210 and 220 and for selecting the appropriate source of power to be supplied to the flash memory array on lines 260 and 264.

The flash memory array power is provided by lines 260, and 262, and 264. Line 260 supplies either Vpp from Vpp pad 295 or 12 volts from charge pumps 210 and 220 to the gates of the flash cells. Line 264 supplies the appropriate voltage to the drains and sources during programming and erase operations. Line 262 supplies either 5 volts from charge pump 220 or $V_{CC}$ to the flash memory device. Line 282 is used to enable or disable $V_{CC}$ detector 232.

Voltage controlled oscillators (VCOs) 240 and 241 are used to drive associated charge pumps 210 and 220, respectively. $V_{REF}$ 270 is used to generate a reference voltage for the VCOs. The reference voltage and feedback from the output of charge pumps are used as control voltages by the VCOs to help control the output voltage of charge pumps 210 and 220. VCO 242 serves as a standby VCO when the flash memory is in a standby mode. The flash memory draws considerably less current in the standby mode.

The high current and the low current variable stage charge pumps are reconfigured depending upon the operational mode and the nominally detected values of Vpp (i.e., 3.3 or 5 volts). Table 2 illustrates the configurations for variable stage charge pump 220 for different Vpps and operational modes:

TABLE 2

High Current Variable Stage Charge Pump (220)

| $V_{PP}$ | Mode | | |
|---|---|---|---|
| | program | verify | erase |
| 5 | 18/3 | 18/3 | 18/3 |
| 3.3 | 18/3 | 18/3 | 9/6 |

Table 3 illustrates the configurations for variable stage charge pump 210 for different Vpps and operational modes:

TABLE 3

Low Current Variable Stage Charge Pump (210)

| $V_{PP}$ | Mode | | |
|---|---|---|---|
| | program | verify | erase |
| 5 | 4/3 | 4/3 | 4/3 |
| 3.3 | 2/6 | 2/6 | 2/6 |

Thus in the embodiment illustrated in FIG. 2, when Vpp has a nominal value of 5 volts, variable stage charge pump 210 (the high current charge pump) is configured to have 18 parallel-coupled sets of stages, each set including 3 serially-coupled stages during the program, verify, and erase operational modes.

For the read mode, low current variable stage charge pump 220 is not used and can be turned off. During a read operation Vpp might be zero. Therefore if high current charge pump 220 is needed it will receive its power from $V_{CC}$ instead of Vpp during the read mode. If $V_{CC}$ is less than 4.0 volts (as determined by the 3/5 volt detector 232), then high current charge pump 220 is needed to provide 5 volts for the wordlines (i.e., gates of the flash memory cells) on line 262. In such a case, charge pump 220 is in the 18/3 configuration in this embodiment. Otherwise, $V_{CC}$ is presumed to be sufficient and line 262 is switched to provide the wordline voltage from VCC instead of from charge pump 220 (which can be turned off because it is no longer required).

With respect to the embodiments presented above regarding flash memory circuitry, the variable stage charge pump circuitry might be manufactured within the same package as the flash memory array.

Alternatively, the variable stage charge pump circuitry might be located external to the flash memory array package.

In the preceding detailed description, the invention is described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A variable stage charge pump comprising:
 n charge pumps including a first charge pump and m other charge pumps;
 m first switches, wherein each first switch couples an input of an associated one of the m charge pumps with an output of a preceding charge pump, wherein the first charge pump is the preceding charge pump for the first one of the m charge pumps;

m second switches, each second switch coupling the input of an associated one of the m charge pumps and an input of the first charge pump;

wherein the n charge pumps are series-coupled if all the first switches are in a first position and all the second switches are in a second position, wherein the n charge pumps are parallel-coupled if all the first switches are in a second position and all the second switches are in a first position.

2. The variable stage charge pump of claim 1 further comprising:

a plurality of diode-connected metal-oxide semiconductor field-effect transistors, each coupled between an output of one of the n charge pumps and the common output node.

3. The variable stage charge pump of claim 1 wherein at least one of the plurality of first and second switches further comprises a low threshold voltage metal-oxide semiconductor transistor.

4. The variable stage charge pump of claim 1 wherein at least one of the charge pumps includes a plurality of series-coupled stages.

* * * * *